United States Patent
Morris et al.

(10) Patent No.: US 7,036,062 B2
(45) Date of Patent: Apr. 25, 2006

(54) SINGLE BOARD DFT INTEGRATED CIRCUIT TESTER

(75) Inventors: Steven R. Morris, Portland, OR (US); Ajit M. Limaye, Hillsboro, OR (US); Andrew H. Levy, Aloha, OR (US); David S. Kellerman, Lake Oswego, OR (US)

(73) Assignee: Teseda Corporation, Portland, OR (US)

( * ) Notice: Subject to any disclaimer, the term of this patent is extended or adjusted under 35 U.S.C. 154(b) by 441 days.

(21) Appl. No.: 10/264,002

(22) Filed: Oct. 2, 2002

(65) Prior Publication Data

US 2004/0068699 A1 Apr. 8, 2004

(51) Int. Cl.
*G01R 31/28* (2006.01)
*G01R 31/02* (2006.01)
*G01R 31/26* (2006.01)

(52) U.S. Cl. .................... 714/733; 714/734; 714/735; 324/73.1; 324/765

(58) Field of Classification Search ............... 714/724, 714/725, 735, 733, 734; 324/765, 73.1; 377/19

See application file for complete search history.

(56) References Cited

U.S. PATENT DOCUMENTS

| | | | | |
|---|---|---|---|---|
| 5,260,947 A | * | 11/1993 | Posse ........................ | 714/727 |
| 5,654,971 A | * | 8/1997 | Heitele et al. .............. | 714/735 |
| 5,899,961 A | * | 5/1999 | Sundermann ................ | 702/117 |
| 5,948,115 A | * | 9/1999 | Dinteman ................... | 714/738 |
| 6,826,721 B1 | * | 11/2004 | Williamson et al. ........ | 714/725 |

* cited by examiner

*Primary Examiner*—Albert Decady
*Assistant Examiner*—Esaw Abraham
(74) *Attorney, Agent, or Firm*—Klarquist Sparkman, LLP

(57) ABSTRACT

A design for test focused tester has a single printed circuit board tester architecture. By focusing on design for test testing and eliminating functional testing, the design for test focused tester reduces or eliminates requirements for high speed, precision signal formatting and timing circuitry that require a multiple board architecture interconnected via a high speed backplane. The single board architecture places a vector sequencer and vector memory close to the device under test, which provides short, consistent signal paths to the device and eliminates the need for dead cycles and synchronization between tester boards.

16 Claims, 3 Drawing Sheets

SINGLE BOARD DFT INTEGRATED CIRCUIT TESTER

TECHNICAL FIELD

The present invention relates to integrated circuit (IC) testing, and more particularly relates to design-for-test (DFT) integrated circuit testers.

BACKGROUND

Conventional automated test equipment (ATE) for IC testing is designed to exercise the device functionally. This functional testing involves providing the stimulus information that the IC device under test (DUT) is expected to receive in the target application (e.g., the target printed circuit board environment in which the device is intended to operate), and verifying that the DUT responds with the same outputs that were simulated in the design process. In effect, functional testing checks that the device meets its performance specifications. By definition, developing a functional test requires knowledge of how the device is supposed to function. Running a functional test requires an extremely capable and flexible test system. The system must quickly and precisely measure that each of a wide range of responses is within acceptable tolerances, and emulate various electrical environments in which the chip is supposed to function.

In addition, conventional ATE systems are capable of performing many other types of tests. Typically, each pin of the tester can be switched to a DC Parametric Measurement unit to perform DC parametric testing on the pins of the DUT. DC parametric testing is used to verify connectivity between the tester and the IC DUT, and to verify that there are no defects that cause the device's current and voltage characteristics to be outside of its specified range. Often, an ATE tester will provide per-pin DC parametric measurement capabilities for this purpose.

Also, the conventional ATE tester can push timing to its limits, allowing devices to be sorted into faster versus slower categories or bins. The ATE system may have analog instrumentation to test analog functions.

In order to perform functional testing, conventional ATE systems typically consist of several interconnected PC boards containing the logic necessary to drive signals to the device under test (DUT) and receive signals from the DUT. The circuitry also contains the ability to analyze the results of the data returned from the DUT. To accomplish the necessary tests and analysis, these systems may be organized such that much of the circuitry is designed for specialty tasks such as:

Providing some level of control of all of the other boards in the tester

Providing the ability to sequence the test vectors

Providing for multiple types and frequencies of clocking for the DUT and, in some cases, the tester Providing for the storage of digital vectors (signals), and for their output to or input from the DUT, for their retention (in memory) and for their analysis. This includes the ability to compare the results for pass/fail and to perform certain other comparisons and mathematical analyses.

Providing high-precision signal formatting for the data to be driven to the device under test.

Current systems contain a complex array of PC boards with this circuitry, arranged in a frame with backplanes and connectors designed to route the signals to and from the DUT. Because of this organization, signals must be propagated over relatively long distances from their origin to the DUT. In addition, the analysis of the data received from a single DUT pin must often be routed to controllers or computers in the system for a cumulative analysis. Transmitting this data over any significant distance takes more time. Often this time is significant when compared to the vector rate of the DUT. This can result in problems such as:

Delays in Determining Conditional Jumps: situations may arise in which the results of data from the DUT determine which of several possible vector sequences are to be next in control of the DUT.

Delays in Controlling Selective Data Capture: often some of the output from the DUT must be "captured" in the memory of the tester, but only if certain combinations of the DUT signals indicate it is ready to output this data In a traditional tester architecture, the length of time it takes for the tester to route the signals necessary to make these determinations often exceeds the time available in a vector period. This results in the necessity for introducing "dead cycles" into the DUT data stream. These dead cycles are intended to "freeze" the state of the DUT for a period of time while the signals are being routed and the necessary analysis performed. Unfortunately, introducing these dead cycles into a test data stream can result in causing the system to miss defects, or it may cause the DUT to lose synchronization with the tester. Therefore, a tester architecture that causes fewer situations of this sort will help to eliminate these problems and result in a higher quality test of the DUT.

Additionally, much of the architecture of the test equipment being employed today is designed to support precision edge placement and the formatting of multiple signal transitions (edges) in a single vector cycle. This capability is often necessary in certain types of testing. In these cases, the generation of complex waveforms with precise timing relationships to each other is necessary in the testing of the device. These signals allow the device to be tested using what are known as "functional" vectors. These vectors when applied using the precision timing and high-speed capability of the tester can be used to verify that the device being tested meets its timing specifications.

SUMMARY

A design-for-test (DFT)-focused tester described herein improves upon the above-described conventional ATE testers in providing a tester circuitry architecture in which circuitry for exercising a DUT in DFT-related test techniques is carried on a single printed circuit board. This architecture reduces the complexity and expense of the above-described conventional ATE testers by eliminating the complex circuitry for high-precision signal formatting and analysis, and high vector-rate capability required for functional and DC parametric testing, as well as for control and coordination of signals across multiple printed circuit boards in such testers. The single board architecture also provides a more consistent signal path length of drive signals applied to pins of the DUT and receive signals acquired there from. This reduces or eliminates the need with conventional ATE testers to insert dead cycles into the test data stream, and the related problems with loss of synchronization and possible defect misses.

In many testing applications, the formatting, precision, high vector-rate capability, and other expensive architectural features of conventional ATE testers as described above are no longer required. It is increasingly common with new Integrated Circuit designs to include Design For Test (DFT) features that allow a device to be fully tested utilizing much simpler, and less restrictive tester architectures. Nevertheless, these devices continue to be tested on the high-performance conventional ATE test systems with the result that potential cost savings are not realized.

The DFT-focused tester described herein is designed specifically to exercise solely the DFT capabilities of an integrated circuit DUT and to place all of the control and test components of this tester on a single printed circuit (PC) board. With this tester architecture, the routing of the signals becomes simpler, and requires that they travel less distance, thus allowing the system to run at the needed vector rates without having to introduce "dead" cycles into the test program to accommodate decision-making features. Because of this tester architecture, cumbersome precision calibration techniques are no longer necessary. Additionally, the simplicity of this tester architecture results in a significantly lower-cost test system, thus reducing the amortized test cost to the user.

Rather than design the test system to address the general requirements of many different types of IC parameters, as is required to functionally test many different types of devices, the DFT-focused tester is designed to address the requirements of four different types of DFT elements. Designing to meet the needs of these elements offers a great deal over more traditional tester designs:

- The four DFT technologies, DC Scan (sometimes called Stuck-At Scan), AC Scan, Iddx, and Build-In Self-Test (BIST) have almost identical test requirements no matter what device they are a part of.
- With the possible exception of a high-speed clock, none of these DFT elements requires the characteristics of a precision architecture (i.e., formattable drivers, precision waveforms, etc.).

Additional features and advantages of the invention will be made apparent from the following detailed description of embodiments that proceeds with reference to the accompanying drawings.

DETAILED DESCRIPTION

The following description is directed to a DFT-focused tester utilizing a single printed circuit board architecture that carries the circuitry to exercise DFT elements of a device under test. By focusing on implementing DFT test techniques, this architecture reduces the complexity and expense of conventional architectures that implement functional testing and DC parametric testing. The DFT-focused tester can then provide a lower cost IC testing strategy by reducing the capital equipment expense at various stages of IC design and manufacturing.

DFT Test Techniques

In one embodiment described hereafter, the DFT-focused tester implements capabilities to perform four DFT-related test techniques, including DC Scan and AC Scan (collectively referred to as "Internal Scan"), IDDQ and BIST. These techniques are designed to detect specific types of faults in the IC, and they all require the addition of on-chip circuit elements into the IC DUT, and/or adherence to particular design rules during the design process for the DUT.

Internal-Scan Testing

Internal-scan testing requires no knowledge of the device's function to develop the test. Instead, an automated test pattern generator (ATPG), that is part of the ASIC design software, examines the IC's internal structure and generates patterns that stimulate and observe the targeted failure modes. Internal scan structures can support testing for various types of fault models, the most common being DC (stuck-at) and AC (transition and delay path) faults.

BIST

Figure 3:
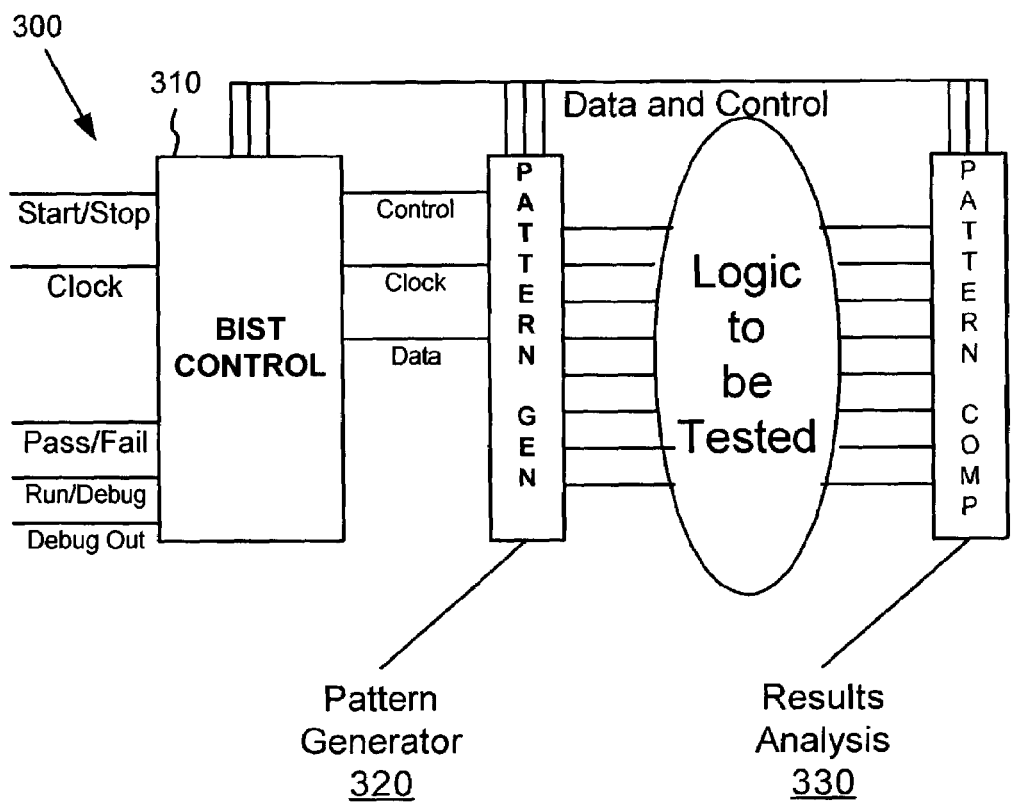
FIG. 3 is a block diagram of BIST circuitry in an IC device that may be subjected to testing (i.e., as a DUT) using the single board DFT-focused tester.

Built-in self test (BIST) is circuitry that is added to an IC design specifically to verify the structural integrity of some portion of that design. BIST comes in many flavors, such as BIST-based testing of embedded SRAM devices, DRAM BIST, logic BIST, and BIST for analog and mixed-signal functions. Exemplary BIST circuitry in an IC device is illustrated in FIG. 3. These BIST techniques generally allow one or more circuit blocks in an IC to be tested with relatively simple digital tester resources that initiate the test, perhaps provide a clock while the test is running (although this too may occur inside the IC being tested) and acquire a flag or signature indicating the test result. BIST outputs range from simple pass/fail flags, to diagnostic data indicating the location and nature of failures, to characterization data providing measured circuit responses.

The combination of AC scan techniques and BIST can allow for very high-performance designs to be tested with relatively simple test equipment. By using AC scan techniques, for example, it is possible for a 50 MHz tester to check the timing performance of a 1 GHz device by verifying the device's internal delay path timing.

With reference to FIG. 3, the BIST circuitry in one exemplary form 300 includes a control section 310 that communicates to the tester to control when the BIST is run and signals completion of a test, pass/fail, etc. The control section 310 sets up a pattern generator 320 to apply the patterns and a pattern compressor/results comparator 330 to accept data coming from the Circuit Under Test. Sometimes the logic to be tested (which often is memory) will have a "wrapper" or "collar" that is used to connect and disconnect the test logic to/from the BIST engine and the rest of the ASIC logic. The IEEE P1500 proposed standard seeks to provide a standard design for such wrappers.

IDDQ

IDDQ (quiescent current) testing involves detecting faults by measurement of very small power supply currents when the DUT has been put into a quiescent state. Like scan and BIST testing, IDDQ is a structural test approach in that it detects silicon defects without requiring any knowledge of the function of the circuit being tested.

Single Board, DFT-Focused Tester Architecture

A DFT-focused tester provides the control, data storage and formatting mechanisms necessary to efficiently utilize the above-described DFT test techniques. The design of the DFT-focused tester as a single printed circuit board architecture 100 can minimize and/or eliminate many of the problems faced in conventional ATE systems, including tester calibration, dead cycles, high-speed capability and costs associated with precision high-speed backplanes, and precision timing and formatting of signals.

Figure 1:
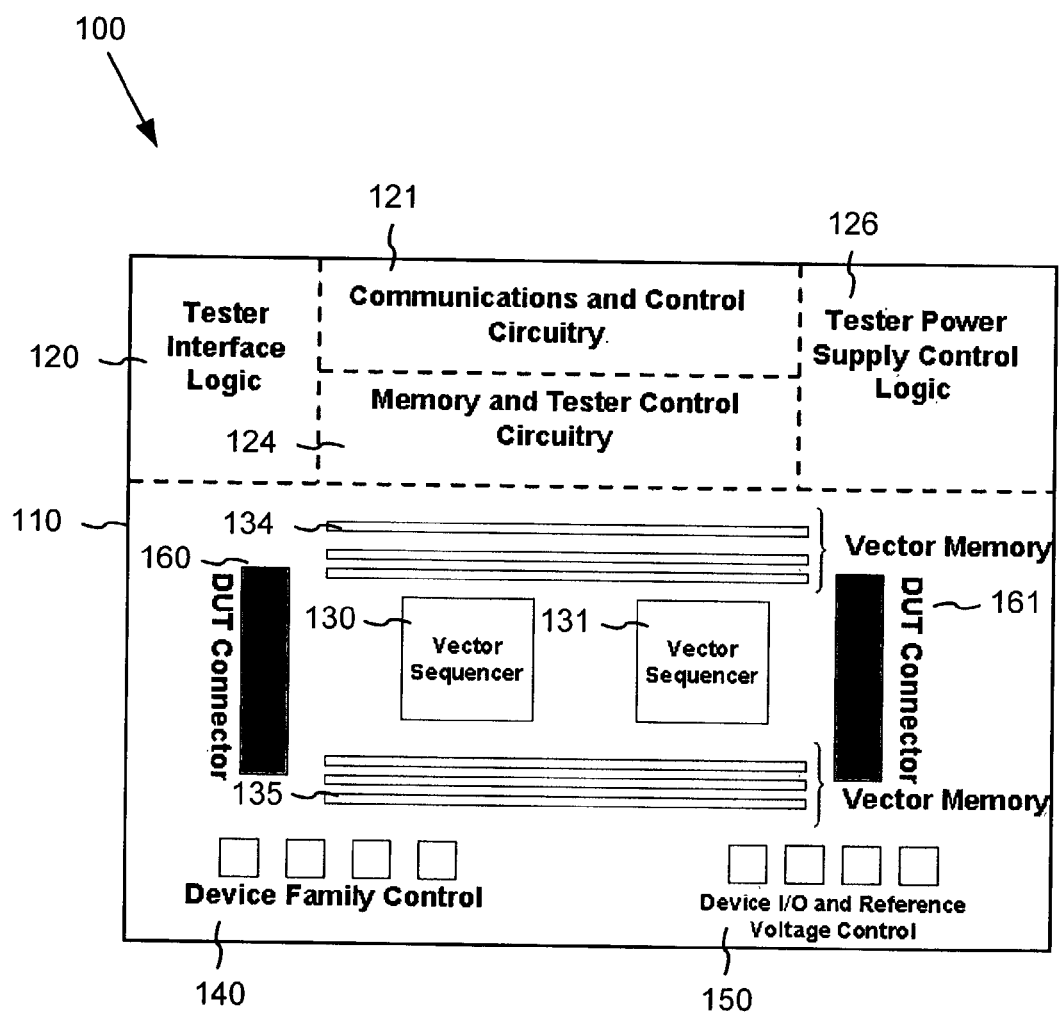
FIG. 1 is a top plan view of a printed circuit board layout for a single board DFT-focused tester.

With reference to FIG. 1, an exemplary layout of the single printed circuit board architecture 100 for a DFT-focused tester includes a communications and control circuitry and tester interface logic sections 120 and 121. These sections contain circuitry implementing the logic necessary to connect the DFT-focused tester to a systems controller, such as a computer (e.g., personal computer, workstation or like), etc., from which the tester is operated by a user and/or programmatically controlled. In one implementation of the architecture 100, the tester interface logic 121 is a local area network (LAN) interface controller (e.g., Ethernet adapter), for connecting to a computer via a LAN network. The circuitry in the communications and control section 120 communicates with the systems controller computer to allow the external systems controller to control operation of the DFT-focused tester.

The systems controller computer is programmed to perform translation of test patterns produced by an ASIC (application-specific integrated circuit) design system (e.g., an EDA (electronic design automation) system) via automatic test pattern generation techniques into a data representation used in the DFT-focused tester. The test pattern data representation includes test patterns and various timing parameters, such as vector rates, clock rates, clock position within the vector cycle, etc. With a tester controller program, the user of the systems controller computer organizes and stores multiple test patterns in a database to form a test and stores multiple tests to form a test sequence. Further, the user can assign a name to each stored test sequence, each stored test and each stored pattern in each test. Using the tester controller program, the user can interactively edit the patterns and timing information in each test. The user also can interactively read all the tests in a single test suite and send selected test information to the single board DFT-focused tester. In one embodiment, one program used on the systems controller computer to produce the stored tests can include the scan test tool described in U.S. Provisional Patent Application No. 60/390,561, entitled, "Creation, Viewing, And Analysis Of The Results Of Integrated Circuit Test Programs Consisting Of Scan Tests," filed Jun. 21, 2002, which is hereby incorporated herein by reference.

The communications and control sections 120–121 receive this test information from the systems controller, and store the test patterns and test sequences into memory on the tester. More particularly, the communications and control section 121 receives the test data and command sequences from the systems controller computer, appropriately sorts the test data and test execution commands, so as to send the test data and test execution commands to appropriate storage locations in memory (in the memory and tester control circuitry and the vector memory described below) on the single board tester.

In the layout of the single board architecture 100, a memory and tester control circuitry (section 124) contains a microprocessor and associated memory, which are used as the primary control and test sequencing mechanism for the tester. In one implementation of the single board architecture 100, the memory and tester control circuitry consists of a Motorola 860 Power PC, associated RAM memory, and connections to the communications and control circuitry, along with other associated logic circuitry, such as circuitry of an IEEE 1149.1 (Standard Test Access Port and Boundary-Scan Architecture) interface.

Tester power supply and control logic (section 126) contains circuitry supplying electrical power to the DUT. The power supply and control logic section 126 includes a set of programmable power supplies with programmable voltage and current limits. The control logic of the power supply includes programming for turning the power supply off and on, and for reading back current measurements.

The single board architecture 100 layout also includes vector sequencers 130–131, which contain the logic necessary to execute vector commands received from the tester control processor (section 124). The vector sequencers circuitry also contains the vector and clock timing and control circuitry. The vector sequencer circuitry consists of reconfigurable circuitry (such as FPGAs) designed specifically be electronically "assignable" to specific data pins on a device to be tested (DUT). This logic extracts vectors from vector memory 134–135 and outputs the vectors to the data pins of the DUT. These pins are the inputs and outputs of the device scan chains, and other data in or data out ports such as the IEEE 1149.1 Test Access Port, etc. Data pins are defined to be NRZ (non-return to zero) signals and are not formattable beyond the assignment of a 0,1, or Z state (for the tester drivers) or a 0, 1, or X state for the tester receivers. The tester drivers (which provide signals to DUT inputs) are designed to change data at the same time at the beginning of a vector cycle. The logic also receives the results from the DUT, compares the results to expected data and records or logs data noting any differences. The tester inputs (device outputs) are all designed to be received into the tester simultaneously at a user selectable point in the vector cycle and to be stored in tester memory.

Figure 2:
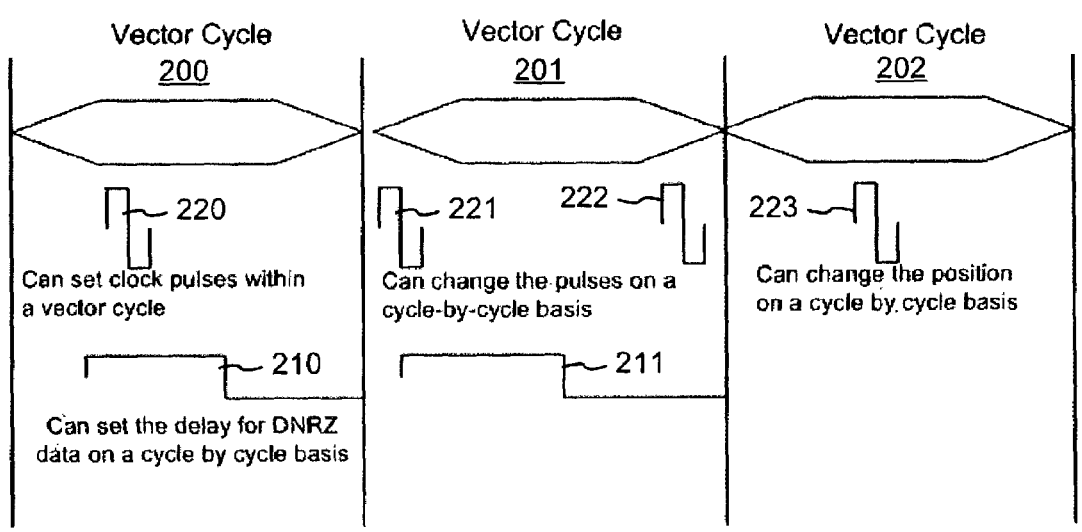
FIG. 2 is a signal timing diagram of test signals produced from the single board DFT-focused tester.

With reference now to FIG. 2, the vector sequencer circuitry also has a series of tester pins designed to provide DNRZ (delayed non-return to zero) control signals 210–211 for DFT testing to the DUT, each of which must change state only at a specific point in the vector cycle 200–202. These DNRZ control signals 210–211 are also provided for by the reconfigurable electronics.

Further, the vector sequencer circuitry provides for a series of clocks pulses 220–223 for output to the DUT. The clocking requirements of a DFT-based test are such that the position and duration of the clock may change from vector cycle to vector cycle. In the vector sequencer circuitry, multiple clocks are provided for each of which may be programmed to pulse (either RZ or R1) at any time within a vector cycle. Specifically, the clock pulses' edges are programmable with respect to time in the vector cycle so that these clocks may be set to change state at any time within the vector cycle. Some of these clocks are then multiplexed together and all may be individually enabled or disabled during each vector cycle. The effect is that the clock pulses may be made to occur at different points in time from vector cycle to vector cycle. By doing so, the single clock pulse requirements of DC Scan or the double clock pulse requirements of AC Scan can be programmed. Additionally, the vector sequencer also can provide clocking for a level sensitive scan design (LSSD).

Finally, the vector sequencer logic provides a vector command processor that can control the sequencing of vectors from/to the DUT in the following manner: (1) The start point in memory and the length (number of vectors to output); (2) The start point in a test and the number of vectors to capture; (3) The start point in a test and the number of vectors to repeat and the repeat count; and (4) A start point in a test to look for a particular sequence of bits coming from one or more DUT pins. When the sequence is detected a length of vector data from one or more pins on the device is captured. This is all done on the fly with no dead cycles.

With reference again to FIG. 1, the DFT-focused tester is configured to be efficient at outputting long serial test sequences and to serially receive and store the data from a variety of DFT sources including scan chains, LBIST and MBIST engines, Iddx monitors, etc. The single board architecture 100 accomplishes this by providing deep vector memory 134–135 directly connected to the configurable vector sequencer 130–131 driver/receivers. In the single board architecture 100, the memory also is partitioned into multiple segments each segment of which is accessed through an independent memory controller.

In one implementation of the single board architecture, the vector sequencers 130–131 consist of four XILINX Virtex II FPGAs (field programmable gate arrays), and the vector memory 134–135 is a set of DDR SDRAM DIMMS (double data rate, synchronous dynamic random access memory, dual in-line memory module). Three of the FPGAs are programmed to extract vectors from their associated vector memory and to output/input the data to/from the DUT. Additionally, independent clock channels and independent DNRZ (delayed non-return to zero) control signals are programmed on each of these three FPGAs, and the fourth FPGA. The fourth FPGA contains command interpreter circuitry and connections to the three FPGAs necessary to control their activities.

The single board architecture 100 layout further includes a device family control section 140, which consists of circuitry capable of providing signals necessary to match the tester logic family with the DUT device family. The device control section circuitry contains the ability to choose the IC family to be tested from a list of acceptable families, and it further contains the ability to change the selected family on a test by test basis. Along with this family information, the tester has the ability to provide for various transmission line terminations selectable from a set of allowable termination techniques. In one implementation of the single board architecture 100, this circuitry consists of stored FPGA programs capable of selecting (e.g., switching) the I/O (input/output) families of the FPGA pins that are connected to the DUT.

In the single board architecture 100 layout, a device I/O and reference section 150 controls the tester driver voltages and the receiver reference settings for the signals applied to and acquired from the DUT. In one implementation of the single board architecture, the device I/O and reference section 150 consists of a reference voltage circuit that applies a digitally controllable reference voltage to the reference input of each of the FPGAs in the vector sequencer 130–131. This section 150 provides the reference voltage for those FPGA logic families that require a reference, such as the SSTTL logic family.

The single board architecture 100 layout further includes DUT connectors 160–161 to connect the tester to the DUT. The DUT connectors 160–161 are located to minimize the distance that signals travel from the vector sequencers to the DUT. The DUT connectors 160–161 can be standard electrical connectors, such as a pair of high-performance Teradyne electrical connectors. In one embodiment, the connectors permit attachment and electrical interconnection of the tester with a load board or probe card that carries the DUT.

In the single board architecture 100, the tester circuitry is configured to provide a variety of communications ports to the load board. These are designed to interface to load-board provided test logic such as Iddq monitors, etc. These communications ports are commonly configured as (but not limited to): RS232, IEEE 1149.1, PCI, and BCD.

Alternative Load Board/Probe Card DFT-Focused Tester Architecture

In another embodiment of the DFT-focused tester, some or all of the above-described tester circuitry may be placed on a standard wafer prober load board, and/or the probe card itself in order to get the circuitry as close as is possible to the DUT. In comparison to conventional ATE systems (which may place some signal conditioning circuitry on the probe card or the load board), this alternative DFT-focused tester places the actual stimulus or measurement circuitry (not just signal conditioning circuitry) on the load board/probe card itself. In conventional ATE test systems with some signal conditioning circuitry found on the probe card or the load board, the conditioned signals are routed back to the data capture/compare circuitry or the measurement circuitry in the testhead. Similarly, test signals from the testhead are often conditioned on the load board or probe card before being transmitted a short distance to the DUT.

This load board/probe card DFT-focused tester provides several advantages over conventional ATE test systems. The load board/probe card DFT-focused tester can reduce or eliminate the need for signal conditioning elements, and provides a much cleaner path for signals in as much as the test signals are not routed through a lot of connectors etc. that lie between the tester and the DUT.

The load board/probe card DFT-focused tester allows for distribution and selection of the functionality to suit the specific needs of the DUT. Thus, it is no longer necessary to try to make a single piece of tester functionality meet the requirements of the DUT.

The load board/probe card DFT-focused tester allows for the remote processing and compression of data simultaneously from multiple DUT sites, thereby reducing the need for transferring large amounts of data back to the testhead.

The load board/probe card DFT-focused tester allows for user-specific programming of tester functionality to suit the needs of the DUT. For example, if time-domain measurement capability is required, devices designed for that specific requirement can be placed on the probe card/load board and programmed for the needed measurements by the test engineer.

In view of the many possible embodiments to which the principles of our invention may be applied, we claim as our invention all such embodiments as may come within the scope and spirit of the following claims and equivalents thereto.

We claim:

1. An integrated circuit design-for-test focused tester comprising:
   a printed circuit board;
   a vector memory carried on the printed circuit board;
   a tester controller memory carried on the printed circuit board;
   a communications and control circuitry section carried on the printed circuit board for receiving test sequence data and tester command data for performing at least one design-for-test test of a connected integrated circuit device from a systems controller and loading said test sequence data in the vector memory and loading said tester command data in the tester controller memory;
   a set of design-for-test test signals derived from the test sequence data;
   a tester controller carried on the printed circuit board for controlling the design-for-test focused tester according to the tester command data loaded in the tester controller memory; and a vector sequencer circuitry section carried on the printed circuit board and operating under control of the tester controller to drive the connected integrated circuit device with the set of design-for-test test signals so as to run the connected integrated circuit device through the at least one design-for-test test, the vector sequencer circuitry section further operating under control of the tester controller to:
1) receive signals produced during the at least one design-for-test test by the connected integrated circuit device,
2) compare the received signals to expected results and
3) produce test results data noting differences of the received signals from the expected results.

2. The integrated circuit design-for-test-focused tester of claim 1 wherein the vector sequencer produces design-for-test test signals to exercise the connected integrated circuit device for at least one of: a DC Scan, AC scan, IDDQ and a Built-in Self Test (BIST) type DFT test.

3. The integrated circuit design-for-test-focused tester of claim 1 further comprising a connector carried on a printed circuit board for interconnecting the printed circuit board with an integrated circuit device.

4. The integrated circuit design-for-test-focused tester of claim 3 wherein the printed circuit board is configured as a test head, and the connector attaches and electrically connects the printed circuit board with a load board or probe card.

5. The integrated circuit design-for-test-focused tester of claim 3 wherein the vector sequencers are arranged on the printed circuit board in adjacent proximity with the connector.

6. The integrated circuit design-for-test-focused tester of claim 1 wherein the printed circuit board is configured as a load board.

7. The integrated circuit design-for-test-focused tester of claim 1 wherein the printed circuit board is configured as a probe card.

8. The integrated circuit design-for-test-focused tester of claim 1 wherein the vector sequencer provides tester driver data signals to the integrated circuit in vector cycle intervals, and receives the connected integrated circuit device-produced signals at different points in time during at least two vector cycle intervals.

9. The integrated circuit design-for-test-focused tester of claim 8 wherein the different points in time are programmable via the tester command data.

10. The integrated circuit design-for-test-focused tester of claim 8 wherein the vector sequencer further provides a clock signal having clock pulses occurring at different points in time during the vector cycle intervals.

11. The integrated circuit design-for-test-focused tester of claim 10 wherein edges of the clock pulses are programmable via the tester command data to occur at selected times during the vector cycle intervals.

12. The integrated circuit design-for-test-focused tester of claim 10 wherein edges of the clock pulses are programmable via the tester command data to occur at selected times during the vector cycle intervals and where the clock pulses vary between vector cycles within a test sequence.

13. The integrated circuit design-for-test-focused tester of claim 10 wherein the clock pulses provide any of a DC scan clock, a double-pulse AC scan clock, and level sensitive scan design clocking.

14. The integrated circuit design-for-test-focused tester of claim 8 wherein the vector sequencer further provides control signals to the connected integrated circuit device, the control signals programmable to occur at least two different points in time during the vector cycle intervals.

15. The integrated circuit design-for-test-focused tester of claim 14 wherein the control signals are programmable on a vector cycle-by-cycle basis to occur at delay times during the vector cycle intervals wherein the delay times vary from vector cycle to vector cycle.

16. The integrated circuit design-for-test-focused tester of claim 1 further comprising an integrated circuit family selection circuitry for selectively configuring the vector sequencer to provide the design-for-test test signals and to receive the signals produced during the at least one design-for-test test in conformance with a selected integrated circuit family type.

* * * * *